United States Patent
Braunger et al.

(10) Patent No.: US 9,431,719 B2
(45) Date of Patent: Aug. 30, 2016

(54) CONTACT PIN

(71) Applicant: Robert Bosch GmbH, Stuttgart (DE)

(72) Inventors: Joachim Braunger, Zaberfeld (DE); Ulrich Becker, Niefern-Oeschelbronn (DE); Richard Gueckel, Schwieberdingen (DE); Markus Kroeckel, Schwieberdingen (DE)

(73) Assignee: Robert Bosch GmbH, Stuttgart (DE)

( * ) Notice: Subject to any disclaimer, the term of this patent is extended or adjusted under 35 U.S.C. 154(b) by 99 days.

(21) Appl. No.: 14/361,770

(22) PCT Filed: Nov. 20, 2012

(86) PCT No.: PCT/EP2012/073084
§ 371 (c)(1),
(2) Date: May 30, 2014

(87) PCT Pub. No.: WO2013/079356
PCT Pub. Date: Jun. 6, 2013

(65) Prior Publication Data
US 2014/0299368 A1    Oct. 9, 2014

(30) Foreign Application Priority Data
Dec. 2, 2011   (DE) .................. 10 2011 087 616

(51) Int. Cl.
*H01B 5/00*         (2006.01)
*H05K 1/11*         (2006.01)
(Continued)

(52) U.S. Cl.
CPC ................ *H01R 4/02* (2013.01); *H01R 12/58* (2013.01); *H01R 13/04* (2013.01); *H01R 43/16* (2013.01); *H01R 43/205* (2013.01); *H05K 1/11* (2013.01); *Y10T 29/49149* (2015.01)

(58) Field of Classification Search
CPC ........ H01R 4/02; H01R 12/58; H01R 43/16; H01R 43/205; H05K 1/11; Y10T 29/49149
USPC ....... 439/82, 751, 876, 884; 174/126.1, 261; 29/843
See application file for complete search history.

(56) References Cited

U.S. PATENT DOCUMENTS

| | | | | |
|---|---|---|---|---|
| 2,991,440 A | * | 7/1961 | Kulka | .............. H01R 9/091 |
| | | | | 174/267 |
| 4,420,877 A | * | 12/1983 | McKenzie, Jr. | ....... H05K 3/308 |
| | | | | 228/180.1 |

(Continued)

FOREIGN PATENT DOCUMENTS

| | | |
|---|---|---|
| DE | 4126574 | 2/1993 |
| DE | 29817129 | 2/2000 |

(Continued)

OTHER PUBLICATIONS

International Search Report for Application No. PCT/EP2012/073084 dated Jan. 30, 2013 (English Translation, 1 page).

(Continued)

*Primary Examiner* — Sherman Ng
(74) *Attorney, Agent, or Firm* — Michael Best & Friedrich LLP

(57) ABSTRACT

The invention relates to a contact pin, comprising an angular end section, which is in particular designed for connecting to a wire or plug, wherein the angular end section has an angular cross-section. According to the invention, the contact pin has a round end section that is opposite the angular end section and that is designed for soldering to a circuit board. The round end section has a cross-section that is round at least in some sections of the circumference.

20 Claims, 4 Drawing Sheets

(51) Int. Cl.
*H01R 13/42* (2006.01)
*H01R 4/02* (2006.01)
*H05K 3/00* (2006.01)
*H01R 12/58* (2011.01)
*H01R 13/04* (2006.01)
*H01R 43/16* (2006.01)
*H01R 43/20* (2006.01)

(56) References Cited

U.S. PATENT DOCUMENTS

| | | | | |
|---|---|---|---|---|
| 4,494,308 | A * | 1/1985 | Schauer | H01R 9/091 29/858 |
| 4,501,065 | A * | 2/1985 | Zemek | H05K 13/043 227/95 |
| 4,575,176 | A * | 3/1986 | Castello | H01R 43/20 29/879 |
| 4,802,862 | A * | 2/1989 | Seidler | H01R 12/585 439/83 |
| 4,907,988 | A * | 3/1990 | Tilse | H01R 12/58 439/751 |
| 7,723,620 | B2 * | 5/2010 | Kawade | H01L 23/49811 174/267 |
| 2002/0052146 | A1 * | 5/2002 | Custer | H01R 9/091 439/625 |
| 2008/0009155 | A1 * | 1/2008 | Ide | H01R 43/0256 439/83 |
| 2012/0289102 | A1 * | 11/2012 | Moll | H01R 43/16 439/890 |

FOREIGN PATENT DOCUMENTS

| | | |
|---|---|---|
| JP | S5233072 | 3/1977 |
| JP | S61117468 | 6/1986 |
| JP | 04-039877 | 2/1992 |
| JP | 4039877 | 2/1992 |
| JP | H05121142 | 5/1993 |
| JP | H07226240 | 8/1995 |
| JP | H08148205 | 6/1996 |
| JP | H09223529 | 8/1997 |
| JP | 10241760 | 9/1998 |
| JP | H10241760 | 9/1998 |
| JP | 2003-051349 | 2/2003 |

OTHER PUBLICATIONS

NN: "Lotstift," Wikipedia, Oct. 5, 2010, XP002689884, Retrieved from the Internet on Jan. 9, 2013: URL:http://de.wikipedia.org/wiki/L%C3%B6tstift.

* cited by examiner

CONTACT PIN

BACKGROUND OF THE INVENTION

The invention relates to a contact pin having an angular end section that is designed in particular for connecting to a wire or plug, wherein the angular end section has an angular cross-section.

In the case of contact pins that are known from the prior art, in particular solder pins, the problem has been recognized that as the temperature of a contact pin that is being soldered to a circuit board changes, in particular as a result of thermal expansion of mutually different materials, wire-drawn contact pins that have a square or rectangular cross-section can cause a weakening of the solder site as a result of grooves occurring in the solder in the region of the aperture.

SUMMARY OF THE INVENTION

In accordance with the invention, the contact pin of the type mentioned in the introduction has a round, preferably rounded, end section that lies opposite the end section and is designed for the purpose of being soldered to a circuit board, wherein the cross-section of the round end section is embodied in a circular manner at least in sections of the periphery. The round end section provides the advantage that—in comparison to a corner in the end section—grooves are not formed in the solder. It is of further advantage that a solder connection between the contact pin and the circuit board cannot be damaged, in particular interrupted, which increases the reliability of the solder connection by means of the contact pin.

It is preferred that the round end section is produced by means of re-shaping, in particular by means of stamping, an angular end section, in particular an angular wire. The angular end section has for example a square or rectangular cross-section.

By means of the re-shaping process, in particular stamping process, a wire that has a rectangular or square cross-section and is in the form of bar stock or rolled material can be cut into contact pins that are formed in each case from a longitudinal section of the wire. The contact pin can consequently be produced in an advantageous manner from an angular wire, for example from a raw wire that is bar-shaped or is wound onto a spool.

The contact pins can be re-shaped in a circular manner with the end section that is provided for soldering purposes, which advantageously only requires the use of one further tool. Prior to being re-shaped in a circular manner, a diameter of the previously angular end section can be reduced by means of a punching process. Once the round shape has been produced, the contact pin can be inserted—by way of example by a pick-and-place machine—into an aperture of a circuit board.

The aperture can be produced by way of example by means of a rotary-bit drilling process, a laser drilling process or by means of a die-cutting process.

In a preferred embodiment, the contact pin comprises a connecting section that is formed from a longitudinal section of the contact pin and connects the angular end section to the round end section, wherein a diameter of the connecting section is tapered along a longitudinal extension of the contact pin from the angular end section towards the round end section. The contact pin thus comprises in the region of the connecting section a cross-section that tapers towards the round end section. In an advantageous manner, the tapering connecting section avoids a sharp edge as the transition from the angular end section to the round, in particular rounded, end section.

The angular, in particular rectangular or square, end section is preferably designed for connecting to a plug in particular a connector strip or a male multipoint connector. The plug or the connector strip comprises for this purpose at least one bushing that is designed for holding the end section of the contact pin in an at least in part force-fit manner and electrically contacting said end section of the contact pin.

In a preferred embodiment, the cross-section of the round end section is embodied in a circular manner. This round shape renders it possible to insert the round end section advantageously in a simple manner into the aperture of the circuit board.

In a different embodiment, the cross-section of the round end section is embodied in an elliptical manner. This elliptical shape renders it possible, in the case of an aperture that has a round cross-section, to form a gap between the round end section of the contact pin and a wall of the aperture, into which gap liquid solder can flow, in an advantageous manner at two mutually opposite surface regions of the round end section, which regions comprise a greater radius of curvature than two surface sections that are arranged adjacent thereto in the circumferential direction and have a smaller radius of curvature.

In a preferred embodiment, the cross-section of the round end section has a wavy peripheral contour. It is preferred that rounded webs are formed in the circumferential direction along the longitudinal extension and a radially inwards extending groove is formed in each case between said webs. As a consequence, a gap of a predefined size can be formed between the contact pin and a cylinder wall of the aperture in an advantageous manner in the region of the groove between two webs. The rounded areas of the webs can in each case contact the cylinder wall. Liquid solder can be drawn in between the webs in the region of the groove by means of capillary action into the gap that is formed between the webs.

The size of the gap between the contact pin and a cylinder wall of the aperture of the circuit board can thus be fixed in a precise manner. An optimum gap size can be determined by way of example in an empirical manner depending upon the solder that is being used.

The size of the gap is further advantageously to a great extent not dependent upon a positioning of the contact pin in the aperture since the webs in each case form a contact point against the wall of the aperture.

In a preferred embodiment, at least three webs and three grooves are formed along the longitudinal extension of the round end section. As a consequence, the contact pin can be advantageously centered in a precise manner in the aperture.

In a preferred embodiment, the grooves are formed in each case for the purpose of generating a capillary action for liquid solder against a wall of a circular cylindrical aperture of the circuit board, which wall contacts the webs. As a consequence, liquid solder can be drawn in an advantageous manner into the gap in the region of the groove. It is thus possible to produce a reliable solder connection and consequently also a reliable electrical contact between the contact pin and the circuit board. The aperture comprises for this purpose a metal layer by way of example in the region of the wall of the aperture. The metal layer can be formed by way of example by means of a galvanizing process. The metal layer can be formed in a different embodiment by means of a sleeve or a rivet.

The invention also relates to a circuit board having at least one contact pin of the type previously described. It is preferred that the circuit board comprises at least one aperture that has a circular cross-section and the contact pin that has the round end section is arranged in said aperture. It is further preferred that the contact pin is soldered to the circuit board at least in the region of the round end section. The solder connection can be produced by way of example by means of a solder wave bath.

The invention also relates to a method for connecting a contact pin, in particular a contact pin in accordance with the previously described type, to a circuit board. In the case of the method for connecting a contact pin, in particular a contact pin in accordance with the previously described type, to a circuit board, a cross-section that is embodied in a circular manner at least at one section of the periphery is produced by means of re-shaping the angular end section at an end section of a wire that forms the contact pin and comprises in particular a square cross-section. In the case of the method, it is preferred that at least one web that is embodied by the corner of the cross-section is re-shaped in a circular manner. It is further preferred that the contact pin having the re-shaped end section is inserted into an aperture of the circuit board and soldered in said aperture.

It is preferred that the size of the cross-section of the end section is reduced prior to the re-shaping process by means of a punching process. As a consequence, the rounded end section can have a smaller diameter than if the process step of stamping were not performed.

BRIEF DESCRIPTION OF THE DRAWINGS

The invention is described hereinunder with reference to figures and further exemplary embodiments. Further advantageous embodiments are evident from the features described in the figures and in the dependent claims.

DETAILED DESCRIPTION

Figure 1:
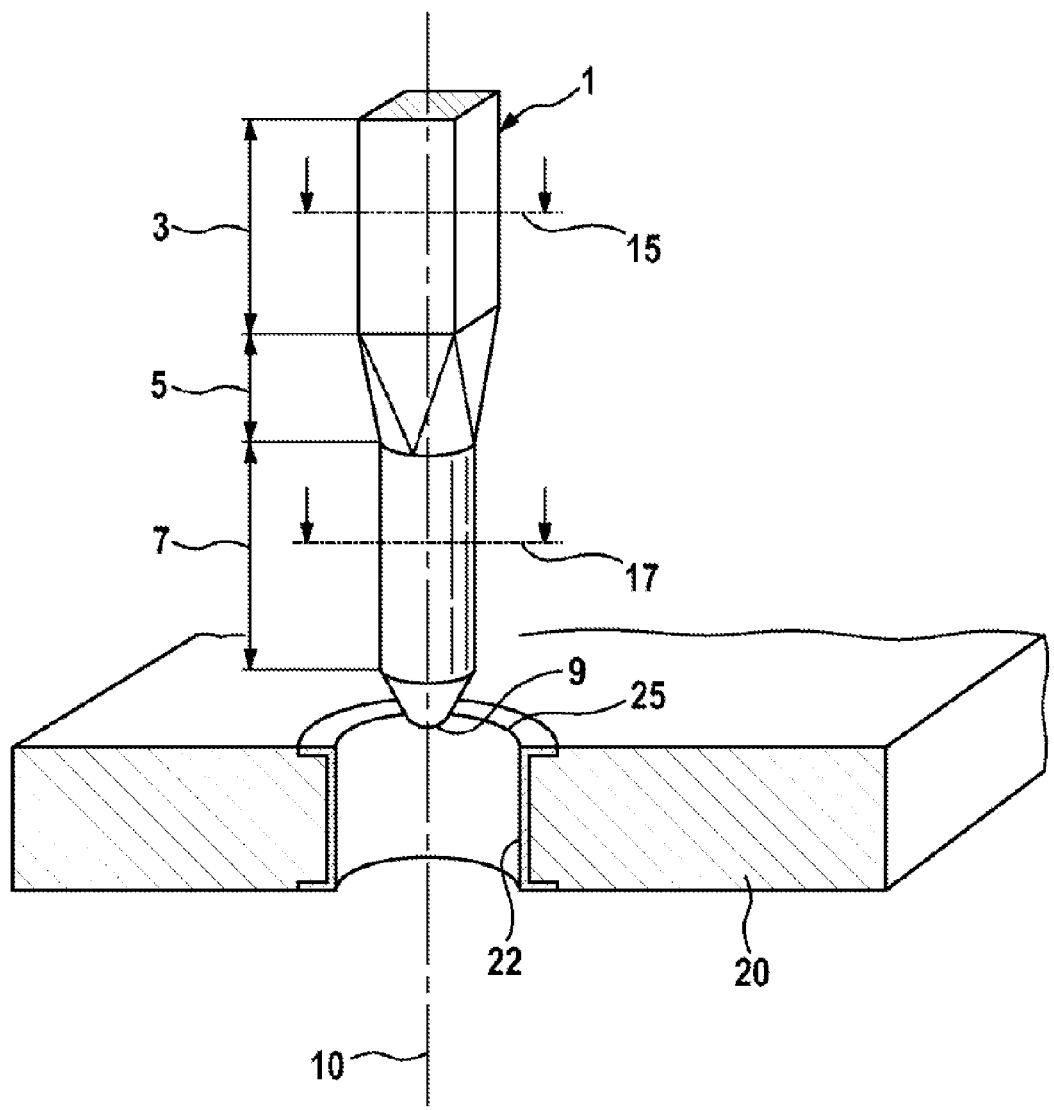
FIG. 1 illustrates—schematically—an exemplary embodiment for a contact pin having a rounded end section that is produced from a square wire by means of punching or previously stamping in order to reduce the size of the cross-section.

FIG. 1 illustrates—schematically—an exemplary embodiment for a contact pin 1. The contact pin 1 comprises an end section 3 that is designed for connecting to a plug, in particular a plug connector. The end section 3 extends along a longitudinal axis 10 of the contact pin 1. The contact pin 1 also comprises an end section 7 that lies opposite the end section 3 that is illustrated in part in FIG. 1. The end section 7 transforms into an end 9 that is formed in a tapering rounded manner. As a consequence, the contact pin 1 can be inserted with the end section 7 into a circuit board 20, in particular into an aperture 25 of the circuit board. The aperture 25 is provided in the region of a wall of the aperture 25 with a metal layer 22. The metal layer 22 can be formed by way of example by means of a metal sleeve or a metal layer that is produced by means of a galvanizing process. The design of the end section 7 that tapers towards the end 9 facilitates advantageously the process of inserting the end section 7 into the aperture 25 of the circuit board 20.

The contact pin 1 is embodied in the region of the end section 3 with a square cross-section. A connecting section 5 extends between the end section 3 and the end section 7 and in said connecting section a diameter of the contact pin 1 tapers towards the commencement of the end section 7. The contact pin 1 has a round cross-section in the region of the end section 7. Two section lines 15 and 17 are illustrated.

Figure 2:
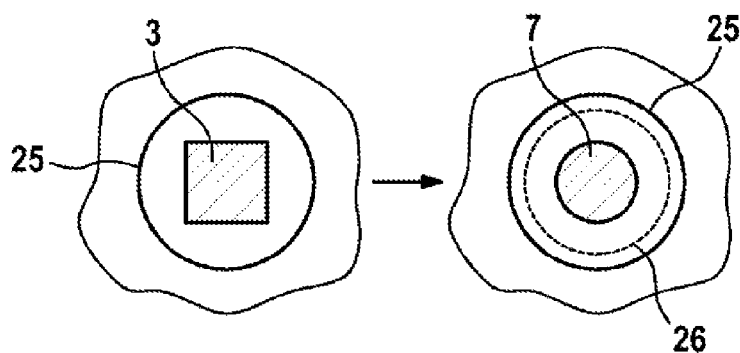
FIG. 2 illustrates—schematically—with reference to cross-sectional representations, a method for producing the contact pin that is illustrated in FIG. 1.

FIG. 2 illustrates—schematically—a method for producing the contact pin that is illustrated in FIG. 1. The figure illustrates a cross-section in the region of the section line 15 of the contact pin 1 that is illustrated in FIG. 1. The figure also illustrates the edge of the aperture 25 in a plan view. The aperture 25 in this exemplary embodiment is formed by means of a circular cylindrical bore. Prior to re-shaping the end section 7 to form an end section 7 with a rounded cross-section, the cross-section of end section 7 is the same shape as the end section 3. After the cold re-shaping process, by way of example after stamping the end section 7, the end section has a round cross-section. The end section 7 can be further reduced in size by means of a stamping process prior to the re-shaping process for the purpose of reducing the size of a diameter. By virtue of being re-shaped in a circular manner, the end section 7 has a smaller diameter than the end section 3, in particular the diagonal of the end section 3 from one corner to an opposite lying corner.

The aperture of the circuit board 20 in FIG. 1 can therefore be selected in an advantageous manner to be smaller than when the end section has an angular cross-section. This is illustrated by the aperture 26 that is represented by the broken line, which aperture can be provided in the circuit board 20 in place of the aperture 25. As a consequence, it is possible to simplify a circuit board layout more easily since in the case of a smaller aperture 26 more circuit board surface area is available for conductor tracks in comparison to an aperture 25 that has a larger diameter.

Figure 3:
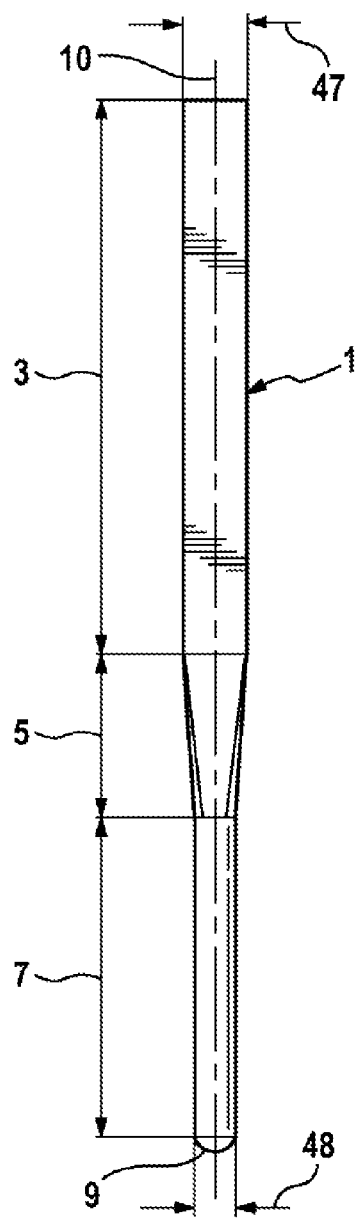
FIG. 3 illustrates—schematically—in a lengthwise view, the contact pin illustrated in FIG. 1.

FIG. 3 illustrates—schematically—in a lengthwise view, the contact pin previously illustrated in FIG. 1. The figure illustrates the longitudinal axis 10, the end section 3 for connecting to a plug, the connecting section 5 and the end section 7 for inserting into an aperture, in particular the aperture 25 of the circuit board 20 in FIG. 1. The contact pin 1 has in the region of the end section 3 an edge length 47 that in this exemplary embodiment amounts at least to or is precisely 0.5 mm. The contact pin 1 has in the region of the end section 7 a diameter 48 that is by way of example equal to half the length of a diagonal of the square cross-section of the end section 3. The contact pin 1 is formed in the region of the end 9 in a tapering rounded manner.

Figure 4:
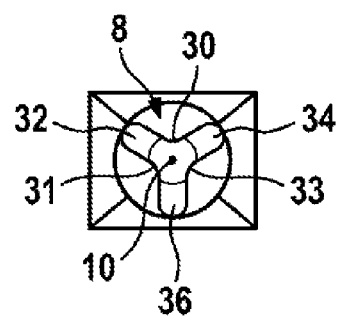
FIG. 4 illustrates—schematically—a variant of a rounded end section of a contact pin that is illustrated in a lengthwise view in FIG. 5.

FIG. 4 illustrates—schematically—an exemplary embodiment for a contact pin 2. The contact pin 2 comprises—in a similar manner to the contact pin 1—an end section 3 having a rectangular cross-section. The contact pin 2 comprises—in a different manner to the contact pin 1—an end section 8 that is designed for the purpose of being soldered in a aperture of a circuit board, in particular the aperture 25 of the circuit board 1 in FIG. 1. The end section 8 has a cross-section that has a wavy peripheral contour. As a consequence, three webs, namely a web 32, a web 34 and a web 36, are formed in the end section 8 and grooves extend between said webs along the longitudinal axis 10 that is illustrated in more detail in FIG. 5. The groove 31 extends between the web 32 and the web 36, the groove 30 extends between the web 32 and the web 34 and the groove 33 extends between the web 34 and the web 36. If by way of example the web 32 and the web 34 abut against the wall of the aperture 25 in the region of one end, then space still remains in the groove 30 between the webs 32 and 34 and liquid solder that is flowing in said groove by means of capillary action can be drawn into the gap that is formed between the groove 30 and the wall of the aperture 35. Mutually adjacent webs of the end section 8 face radially outwards in each case at an angle of 120°. The diameter at a periphery that spans the webs 32, 34 and 36 in a circular manner amounts to 0.35 mm in this exemplary embodiment. A longitudinal axis 10 is located at the center of the cross-section of the end section 8.

Figure 5:
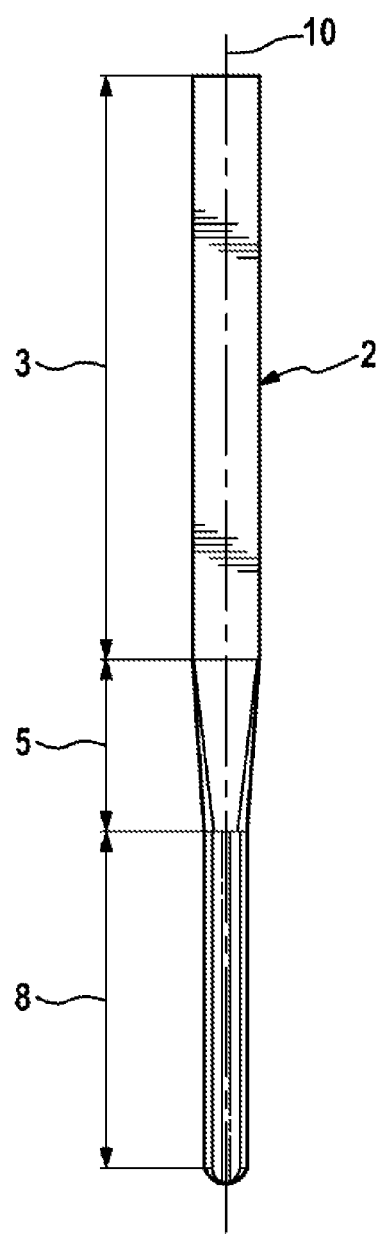
FIG. 5 illustrates—schematically—a contact pin in a lengthwise view, the cross-section of the end section of said contact pin being illustrated in FIG. 4.

FIG. 5 illustrates—schematically—a contact pin 2 in a lengthwise view, the cross-section of the end section 8 of said contact pin being illustrated in FIG. 4. The length of one edge of the rectangular cross-section in the region of an end section 3 amounts in this exemplary embodiment at least to or is precisely 0.5 mm. The end section 8 in this exemplary embodiment is produced together with a connecting section 5 by means of a stamping re-shaping process. The end section 3, the connecting section 5 and the end section 8 extend in each case along a longitudinal axis 10 of the contact pin 2.

Figure 6:
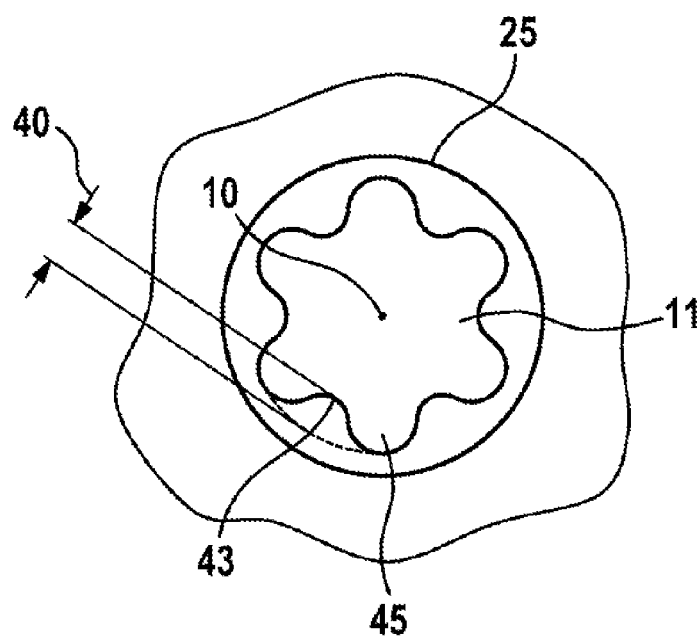
FIG. 6 illustrates—schematically—a variant for a cross-section of an end section of a contact pin having webs and grooves formed along a longitudinal extension.

FIG. 6 illustrates—schematically—an exemplary embodiment for a cross-section of an end section 11 that forms the end section for inserting into an aperture of a circuit board of a contact pin 2 in place of the end section 8. A longitudinal axis 10 is located at the center of the cross-section of the end section 11. The figure illustrates the aperture 25 in which the end section 11 is arranged. The end section 11 has a wavy peripheral contour in the cross-sectional view. As a consequence, webs that extend with a curvature in a radially outwards manner are formed along a longitudinal axis 10. A groove extends between mutually adjacent webs along the longitudinal axis 10. The web 45 and the groove 43 are illustrated in an exemplary manner. The figure also illustrates a spacing 40 from a groove that extends radially inwards and is enclosed in the circumferential direction by two mutual adjacent webs.

The broken line represents the wall of the aperture 25 that can contact by way of example the mutually adjacent webs. The spacing 40 is created by means of which a gap is formed in which liquid solder can flow. The end section 11 comprises six webs and six grooves in this exemplary embodiment.

Figure 7:
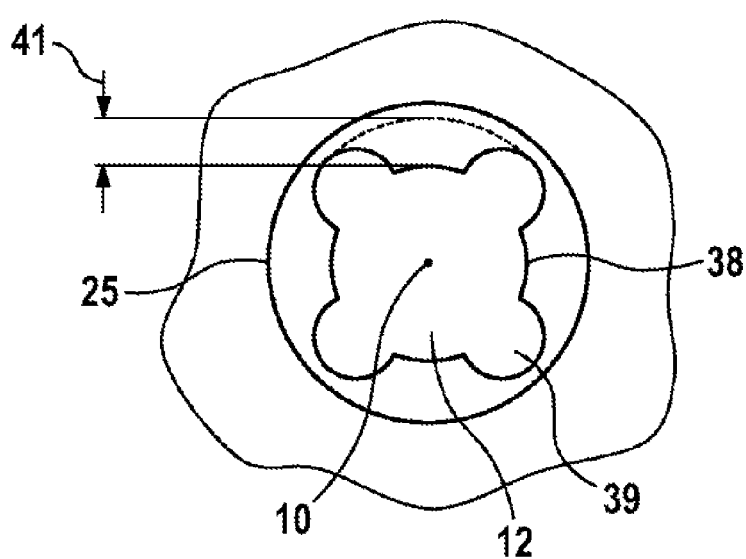
FIG. 7 illustrates—schematically—a variant for a cross-section of an end section of a contact pin having webs and grooves formed along a longitudinal extension, wherein the grooves have a radially outwards convex curvature.

FIG. 7 illustrates—schematically—an exemplary embodiment for an end section 12 that can be formed in place of the end section 8 of the contact pin 2. A longitudinal axis 10 is located at the center of the cross-section of the end section 12. The end section 12 comprises 4 radially outwards facing webs, of which web 39 is illustrated in an exemplary manner. A groove extends radially inwards between two mutually adjacent webs in the circumferential direction. The cross-section of the groove in this exemplary embodiment has a convex shape that extends radially outwards. The convex shape has by way of example a radius of curvature that corresponds to the radius of curvature of the circular cylindrical aperture 25. Thus, it is possible in an advantageous manner to produce an arrangement comprising a circuit board having at least one aperture 25 and at least one contact pin 2, wherein the end section 12 is arranged in the aperture 25. The figure also illustrates a spacing 41 that remains constant at the peripheral section and the groove 38 extends on said peripheral section towards a wall, illustrated by the broken line, of the aperture 25, which wall contacts mutually adjacent webs. As a consequence, a gap is formed that has a predetermined width that corresponds to the spacing 41, into which liquid solder can flow. The spacing 41 can be dimensioned by way of example in such a manner that a capillary action for a liquid solder is greatest at a predetermined solder temperature. The groove 38 can only be completely filled with solder in this manner advantageously along the circumferential direction in the cross-section. This embodiment is based on the knowledge that liquid solder can no longer flow into excessively large or particularly fine gaps owing to a lack of capillary action or rather owing to its surface tension. A capillary action is reduced in particularly large gaps in comparison to the gap with the optimum spacing 41.

What is claimed is:

1. A contact pin (1, 2) having an angular end section (3) that is configured for connecting to a wire or plug, wherein the angular end section (3) has an angular cross-section, and
   the contact pin (1, 2) has a round end section (7, 8, 11, 12) that lies opposite the angular end section (3) and is configured to be soldered to a circuit board (20), wherein a cross-section of the round end section is embodied in a circular manner at least in sections of a periphery,
   wherein the contact pin (1, 2) is formed from a raw wire with an angular cross-section, wherein the angular end section (3) corresponds to the angular cross-section of the raw wire and the round end section (7, 8, 11, 12) is re-shaped from an angular end section of the raw wire.

2. The contact pin (1, 2) as claimed in claim 1, characterized in that
   the contact pin (1, 2) comprises a connecting section (5) that is formed by means of a longitudinal section of the contact pin, which connecting section connects the angular end section (3) to the round end section (7), wherein a diameter of the connecting section (5) along a longitudinal extension (10) of the contact pin (1, 2) tapers from the angular end section (3) towards the round end section (7).

3. The contact pin (1, 2) as claimed in claim 1, characterized in that
   the cross-section of the round end section (7) is embodied in a circular manner.

4. The contact pin (1, 2) as claimed in claim 1, characterized in that
   the cross-section of the round end section is embodied in an elliptical manner.

5. The contact pin (1, 2) as claimed in any claim 1, characterized in that
   the cross-section of the round end section (8, 11) has a wavy peripheral contour.

6. The contact pin (1, 2) as claimed in claim 5, characterized in that
   at least three webs (32, 34, 36, 39, 45) and grooves (30, 31, 33, 38, 43) are formed along a longitudinal extension (10) of the round end section (8, 11, 12).

7. The contact pin (1, 2) as claimed in claim 6,
characterized in that
the grooves (43) are formed in each case for generating a capillary action for liquid solder against a wall of a circular cylindrical aperture (25) of the circuit board (20), which wall contacts the webs (39).

8. A circuit board (20) having at least one contact pin (1, 2) as claimed in claim 1,
characterized in that
the circuit board (20) comprises at least one aperture (25) that has a circular cross-section, in which the contact pin (1, 2) is arranged with the round end section (7, 8, 11, 12).

9. The contact pin as claimed in claim 1, wherein the angular end section (3) has a square, cross-section.

10. The contact pin (1, 2) as claimed in claim 1,
characterized in that
the round end section (7, 8, 11, 12) is produced by means of stamping an angular end section of the raw wire.

11. A method for connecting a contact pin (1, 2) to a circuit board (20), the method comprising:
providing a raw wire with an angular cross-section;
forming the contact pin from the raw wire, wherein an angular end section (3) of the contact pin corresponds to the angular cross-section of the raw wire;
forming a re-shaped round end section (7, 8, 11, 12) of the contact pin that lies opposite the angular end section (3) by re-shaping the angular cross-section of the raw wire so that the re-shaped round end section of the contact pin has a circular cross-section at least on one peripheral section;
inserting the re-shaped round end section (7, 8, 11, 12) into an aperture (25) of the circuit board (20); and
soldering the re-shaped round end section into said aperture.

12. The method as claimed in claim 11,
characterized in that
the re-shaped round end section (7, 8, 11, 12) is produced by means of stamping an angular end section of the raw wire.

13. The method as claimed in claim 11,
characterized in that
the contact pin (1, 2) comprises a connecting section (5) that is formed by means of a longitudinal section of the contact pin, which connecting section connects the angular end section (3) to the re-shaped round end section (7), wherein a diameter of the connecting section (5) along a longitudinal extension (10) of the contact pin (1, 2) tapers from the angular end section (3) towards the re-shaped round end section (7).

14. The method as claimed in claim 11,
characterized in that
the cross-section of the re-shaped round end section (7) is embodied in a circular manner.

15. The method as claimed in claim 11,
characterized in that
the cross-section of the re-shaped round end section is embodied in an elliptical manner.

16. The method as claimed in any claim 11,
characterized in that
the cross-section of the re-shaped round end section (8, 11) has a wavy peripheral contour.

17. The method as claimed in claim 16,
characterized in that
at least three webs (32, 34, 36, 39, 45) and grooves (30, 31, 33, 38, 43) are formed along a longitudinal extension (10) of the re-shaped round end section (8, 11, 12).

18. The method as claimed in claim 17,
characterized in that
the grooves (43) are formed in each case for generating a capillary action for liquid solder against a wall of a circular cylindrical aperture (25) of the circuit board (20), which wall contacts the webs (39).

19. The method as claimed in claim 11,
wherein the angular end section (3) has a square, cross-section.

20. The method as claimed in claim 11,
characterized in that
the circuit board (20) comprises at least one aperture (25) that has a circular cross-section.

* * * * *